United States Patent
Kobayashi et al.

(10) Patent No.: US 11,237,577 B2
(45) Date of Patent: Feb. 1, 2022

(54) TEMPERATURE CONTROL SYSTEM INCLUDING MULTIPLE VALVES AND TEMPERATURE CONTROL METHOD

(71) Applicant: Tokyo Electron Limited, Tokyo (JP)

(72) Inventors: Kei Kobayashi, Miyagi (JP); Takehiko Arita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 221 days.

(21) Appl. No.: 16/561,252

(22) Filed: Sep. 5, 2019

(65) Prior Publication Data
US 2020/0117223 A1    Apr. 16, 2020

(30) Foreign Application Priority Data
Oct. 15, 2018   (JP) .............................. JP2018-194627

(51) Int. Cl.
G05D 23/19     (2006.01)
F24F 5/00      (2006.01)
F25B 49/00     (2006.01)
F25B 41/20     (2021.01)
H01L 21/67     (2006.01)

(52) U.S. Cl.
CPC ....... *G05D 23/1919* (2013.01); *F24F 5/0017* (2013.01); *F25B 41/20* (2021.01); *F25B 49/00* (2013.01); *F24F 2005/0025* (2013.01); *F25B 2600/2501* (2013.01); *F25B 2700/2101* (2013.01); *H01L 21/67098* (2013.01)

(58) Field of Classification Search
CPC .. F25B 41/20; F25B 49/00; F25B 2600/2501; G05D 23/1919; H01L 23/34; H01L 23/46; H01L 23/473
See application file for complete search history.

(56) References Cited

U.S. PATENT DOCUMENTS

| | | | |
|---|---|---|---|
| 7,730,935 B1 * | 6/2010 | Bujak, Jr. | F24F 3/06 165/208 |
| 9,664,460 B2 * | 5/2017 | Tabuchi | G05D 23/1393 |
| 2004/0187787 A1 * | 9/2004 | Dawson | H01L 21/6833 118/728 |
| 2006/0219360 A1 * | 10/2006 | Iwasaki | H01L 21/67248 156/345.27 |
| 2014/0165596 A1 * | 6/2014 | Freese | B60H 1/00478 62/3.2 |
| 2017/0092472 A1 * | 3/2017 | Koiwa | H01J 37/32724 |

FOREIGN PATENT DOCUMENTS

JP   2013-105359   5/2013

* cited by examiner

*Primary Examiner* — Jonathan Bradford
(74) *Attorney, Agent, or Firm* — IPUSA, PLLC

(57) ABSTRACT

A temperature control system includes a first pump, a second pump, a temperature adjusting unit, a first flow passage, a second flow passage, a first valve disposed in the first flow passage, a second valve disposed in the second flow passage, a first bypass flow passage connecting the first flow passage to the second flow passage on the temperature adjusting unit side of the first and second valves, a second bypass flow passage connecting the first flow passage to the second flow passage on the flow passage side of the first and second valves, a third valve disposed in the first bypass flow passage, and a fourth valve disposed in the second bypass flow passage. At least one of a pair of the first valve and the second valve, and a pair of the third valve and the fourth valve is a pair of flow rate adjustable valves.

16 Claims, 10 Drawing Sheets

FIG.4

| | FIRST VALVE | SECOND VALVE | THIRD VALVE | FOURTH VALVE | CHILLER DISCHARGING TEMPERATURE | COOLING-SIDE PUMP | HEATING-SIDE PUMP |
|---|---|---|---|---|---|---|---|
| FIRST OPERATION MODE | FULL OPEN | FULL OPEN | FULL CLOSE | FULL CLOSE | Tc | OPERATION | OPERATION |
| SECOND OPERATION MODE | FULL CLOSE | FULL CLOSE | FULL OPEN | FULL OPEN | Tc | OPERATION | OPERATION |
| THIRD OPERATION MODE | OPENING DEGREE CONTROL | OPENING DEGREE CONTROL | FULL OPEN | FULL OPEN | Tc | OPERATION | OPERATION |

FIG.8

| | FIRST VALVE | SECOND VALVE | THIRD VALVE | FOURTH VALVE | CHILLER DISCHARGING TEMPERATURE | COOLING-SIDE PUMP | HEATING-SIDE PUMP |
|---|---|---|---|---|---|---|---|
| FIRST OPERATION MODE | FULL OPEN | FULL OPEN | FULL CLOSE | FULL CLOSE | Tc | OPERATION | OPERATION |
| SECOND OPERATION MODE | FULL CLOSE | FULL CLOSE | FULL OPEN | FULL OPEN | Tc | OPERATION | OPERATION |
| THIRD OPERATION MODE | OPENING DEGREE CONTROL | OPENING DEGREE CONTROL | OPENING DEGREE CONTROL | OPENING DEGREE CONTROL | Tc | OPERATION | OPERATION |

FIG.10

| | FIRST VALVE | SECOND VALVE | THIRD VALVE | FOURTH VALVE | CHILLER DISCHARGING TEMPERATURE | COOLING-SIDE PUMP | HEATING-SIDE PUMP |
|---|---|---|---|---|---|---|---|
| FIRST OPERATION MODE | FULL OPEN | FULL OPEN | FULL CLOSE | FULL CLOSE | Tc | OPERATION | OPERATION |
| SECOND OPERATION MODE | FULL CLOSE | FULL CLOSE | FULL OPEN | FULL OPEN | Tc | OPERATION | OPERATION |
| THIRD OPERATION MODE | FULL OPEN | FULL OPEN | OPENING DEGREE CONTROL | OPENING DEGREE CONTROL | Tc | OPERATION | OPERATION |

TEMPERATURE CONTROL SYSTEM INCLUDING MULTIPLE VALVES AND TEMPERATURE CONTROL METHOD

CROSS-REFERENCE TO RELATED APPLICATION

The present application is based on and claims priority to Japanese Priority Application No. 2018-194627 filed on Oct. 15, 2018, the entire contents of which are hereby incorporated herein by reference.

BACKGROUND OF THE INVENTION

1. Field of the Invention

The present disclosure relates to a temperature control system and a temperature control method.

2. Description of the Related Art

As for a chiller unit, a technology to change the temperature of a temperature controlled medium such as brine in a wide range and at high speed is needed in response to the diversification of process conditions.

Japanese Patent Application Publication No. 2013-105359 discloses a temperature control system including a low temperature control unit and a high temperature control unit.

SUMMARY OF THE INVENTION

In one aspect, the present disclosure provides a temperature control system and a temperature control method that can rapidly and efficiently change a temperature of a temperature controlled medium flowing into a flow passage of a member.

According to an embodiment, there is provided a temperature control system that includes a first pump configured to circulate a temperature controlled medium through a flow passage formed in a member, a second pump configured to discharge the temperature controlled medium, a temperature adjusting unit, a first flow passage connecting one end of the flow passage formed in the member to one end of the temperature adjusting unit to allow the temperature controlled medium to flow therethrough, a second flow passage connecting the other end of the flow passage formed in the member to the other end of the temperature adjusting unit to allow the temperature controlled medium to flow therethrough, a first valve disposed in the first flow passage, a second valve disposed in the second flow passage, a first bypass flow passage connecting the first flow passage to the second flow passage at a position closer to the temperature adjusting unit than the first valve and the second valve, a second bypass flow passage connecting the first flow passage to the second flow passage at a position closer to the flow passage formed in the member than the first valve and the second valve, a third valve disposed in the first bypass flow passage, and a fourth valve disposed in the second bypass flow passage. At least one of a pair of the first valve and the second valve, and a pair of the third valve and the fourth valve is a pair of flow rate adjustable valves.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

BRIEF DESCRIPTION OF THE DRAWINGS

FIG. 4 is a diagram illustrating an example of a state of a valve or the like in each mode of operation of a temperature control system according to a first embodiment;

FIG. 8 is a diagram illustrating an example of a state of a valve and the like in each mode of operation of a temperature control system according to the second embodiment;

FIG. 10 is a diagram illustrating an example of a state of a valve and the like in each mode of operation of a temperature control system according to a third embodiment.

DETAILED DESCRIPTION OF THE PREFERRED EMBODIMENTS

Figure 1:
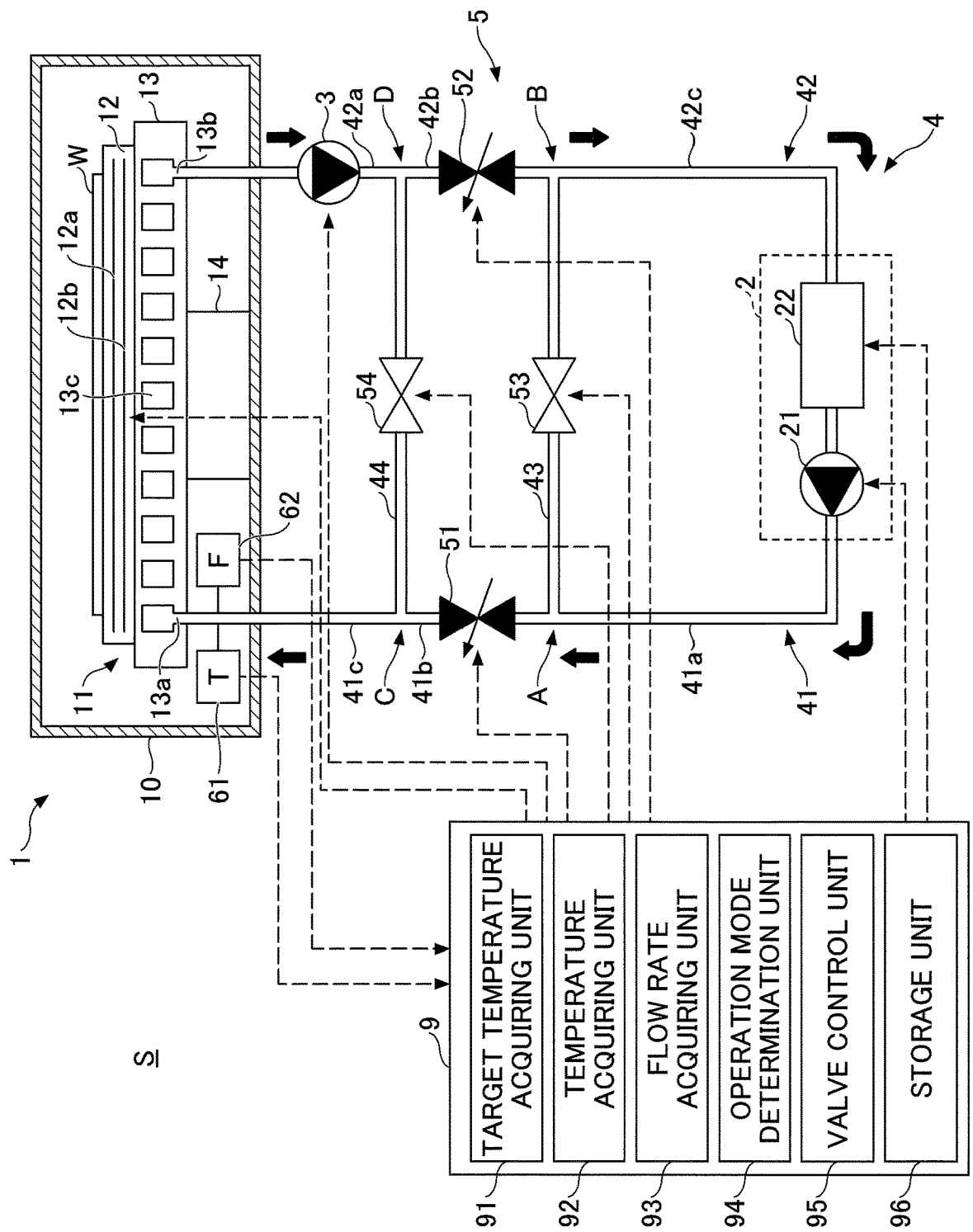
FIG. 1 is a configuration diagram illustrating operation of a temperature control system according to a first embodiment in a first operation mode.

Hereinafter, embodiments for carrying out the present disclosure will be described with reference to the drawings. In each drawing, the same reference numerals are used for the same components and overlapping descriptions may be omitted.

[Configuration of Temperature Control System of First Embodiment]

Figure 2:
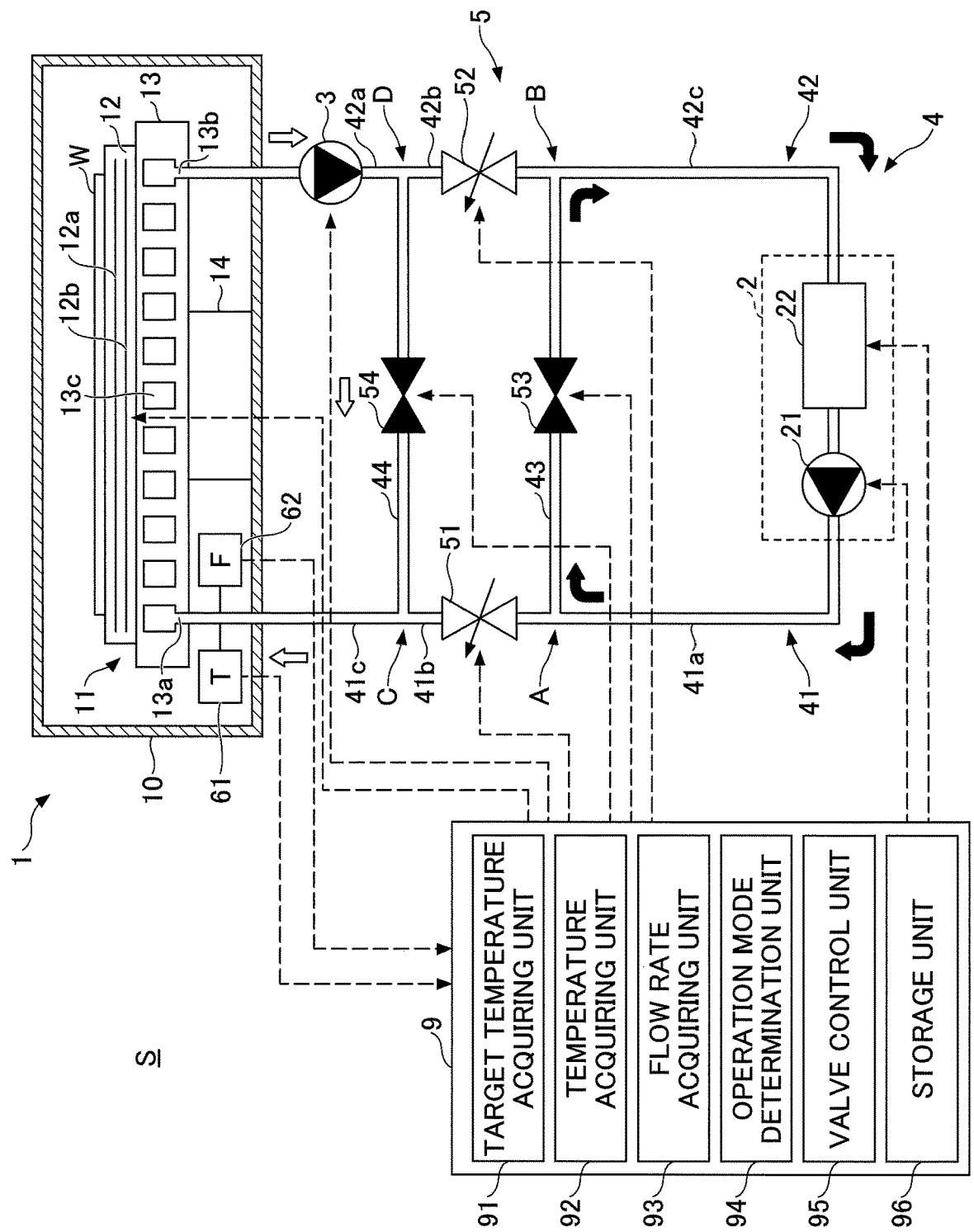
FIG. 2 is a configuration diagram illustrating an operation of a temperature control system according to a first embodiment in a second operation mode.
Figure 3:
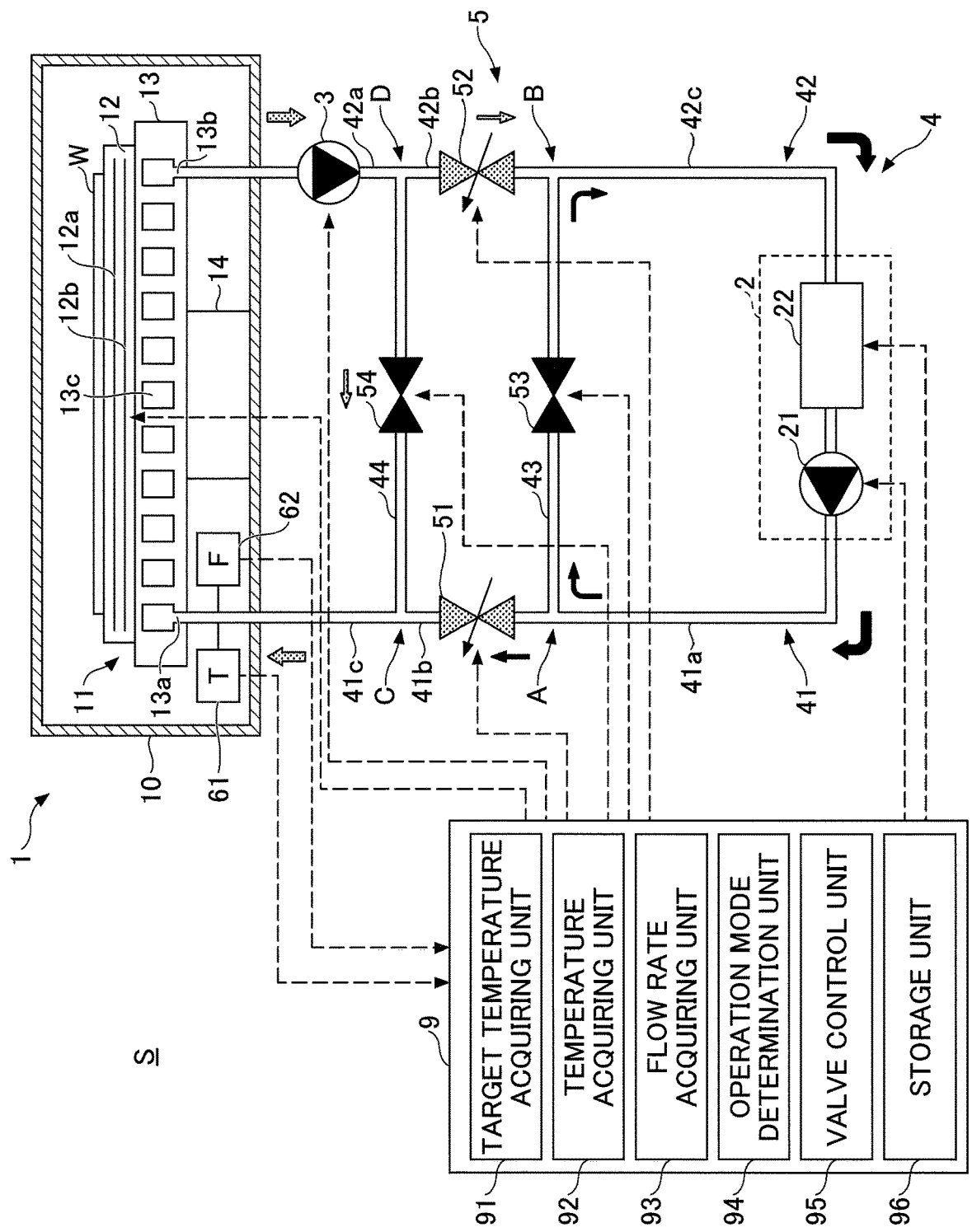
FIG. 3 is a configuration diagram illustrating an operation of a temperature control system according to a first embodiment in a third operation mode.

A temperature control system S according to a first embodiment will be described with reference to FIGS. 1 to 3. FIGS. 1 to 3 are schematic diagrams of the temperature control system S according to the first embodiment, and FIG. 1 illustrates operation in a first operation mode. FIG. 2 illustrates operation in a second operation mode, and FIG. 3 illustrates operation in a third operation mode.

The temperature control system S includes a processing apparatus 1, a chiller 2, a heating-side pump 3, a flow passage 4, a flow passage adjusting unit 5, and a controller 9.

The processing apparatus 1 is a device for processing a wafer W. The wafer W is subjected to a heat treatment, a plasma treatment, a UV treatment, and other treatments. Processing of the wafer W includes any process such as etching, film deposition, cleaning, treatment, and ashing.

The processing apparatus 1 includes a processing chamber 10 and a stage 11 on which a wafer W is placed. The stage 11 includes an electrostatic chuck 12 and a base (member) 13. The electrostatic chuck 12 is disposed on the base 13. The electrostatic chuck 12 includes an electrode 12a, and a heater 12b. The electrostatic chuck 12 electrostatically attracts the wafer W by applying a voltage to the electrode 12a from a DC power source. The wafer W is heated by applying a voltage to the heater 12b from an AC power source. It should be noted that the power to the electrode 12a and the heater 12b is controlled by the controller 9. The base 13 is supported on a support platform 14. A member flow passage 13c having an inlet 13a on one end side and an outlet 13b on the other end side is formed into a ring-like or spiral shape within the base 13. The support platform 14 supports the base 13 inside the processing chamber 10.

The processing apparatus 1 may be configured as a plasma processing apparatus. A radio frequency power source (not illustrated) is connected to the base 13 to supply high frequency power for plasma generation via a matching box (not illustrated). Due to such a configuration, the stage 11 serves as a lower electrode. Also, a gas supply source (not illustrated) for supplying a desired gas into the processing chamber 10 and a vacuum pump (not illustrated) for depressurizing the processing chamber 10 are connected to the processing chamber 10. In the processing chamber 10, a showerhead (not illustrated) is disposed above the stage 11 to serve as an upper electrode while facing the stage 11. Plasma is generated between the showerhead serving as the upper electrode and the stage 11 serving as the lower electrode.

The chiller 2 adjusts the temperature of brine. The chiller 2 includes a cooler (also referred to as a "temperature control unit") 22 for cooling brine and a chiller pump 21 (also referred to as a "cooling-side pump" or a "second pump") 21 for discharging cooled brine. Brine is an example of a temperature controlled medium, and the temperature controlled medium may be cooling water or the like. The cooler 22 is controlled so that the temperature of brine discharged from the chiller 2 becomes a predetermined temperature by the controller 9. The chiller pump 21 is controlled so that the flow rate of discharged brine is controlled to a predetermined flow rate by the controller 9. The cooler 22 for cooling brine is not limited to a cooling device for cooling brine as long as the device can keep the brine temperature at a predetermined temperature. Hereinafter, an example will be described in which the cooler 22 cools brine and discharges brine from the chiller 2.

The heating-side pump 3 (which is also referred to as a "first pump") is a pump for circulating brine through the member flow passage 13c of the base 13. The controller 9 controls the heating-side pump 3 so that the flow rate of the discharged brine becomes a predetermined flow rate. In examples illustrated in FIGS. 1 to 3, the heater-side pump 3 is disposed on the downstream side of the member flow passage 13c (a downstream flow passage 42 that will be described later), and the heater-side pump 3 sanctions brine flowing through the outlet port 13b, thereby allowing brine to flow through the member flow passage 13c. However, the present embodiment is not limited to the above-described configuration. The heating-side pump 3 may be disposed on the upstream side of the member flow passage 13c (a upstream flow passage 41 that will be described later) and the heating-side pump 3 may discharge brine to the inlet port 13a, thereby allowing brine to flow through the member flow passage 13c. Further, the number of the heating-side pumps 3 is not limited to one, but may be two or more.

The temperature control system S includes a flow passage 4 through which brine flows. The temperature control system S includes a flow passage adjusting unit 5 for adjusting the flow of brine. The flow passage 4 includes an upstream flow passage (first flow passage) 41, a downstream flow passage (second flow passage) 42, a first bypass flow passage 43, and a second bypass flow passage 44. The flow passage adjusting unit 5 includes a first valve 51, a second valve 52, a third valve 53, and a fourth valve 54.

The upstream flow passage 41 is a flow passage that connects the discharge side of the chiller 2 to the inlet port 13a. The first valve 51 is disposed in the upstream flow passage 41. The first valve 51 is a flow adjustment valve capable of adjusting an opening degree, and the opening degree is controlled by the controller 9.

The downstream flow passage 42 is a flow passage that connects the outlet port 13b to the inlet side of the chiller 2. The second valve 52 is disposed in the downstream flow passage 42. The second valve 52 is a flow adjustment valve capable of adjusting an opening degree, and the opening degree is controlled by the controller 9.

The first bypass flow passage 43 is a flow passage connecting the upstream flow passage 41 and the downstream flow passage 42 on the chiller 2 side of the first valve 51 and the second valve 52. The first bypass flow passage 43 is a flow passage that bypasses the outlet port 13b when viewed from the side of the chiller 2. The third valve 53 is disposed in the first bypass passage 43. The third valve 53 is an on-off valve whose opening and closing are controlled by the controller 9.

The second bypass flow passage 44 is a flow passage connecting the upstream flow passage 41 and the downstream flow passage 42 on the member flow passage 13c side of the first valve 51 and the second valve 52. The second bypass flow passage 44 is a flow passage that bypasses the chiller 2 when viewed from the side of the outlet port 13b. The fourth valve 54 is disposed in the second bypass flow passage 44. The fourth valve 54 is an on-off valve whose opening and closing are controlled by the controller 9.

A connection portion between the upstream flow passage 41 and the first bypass flow passage 43 is defined as a connection portion A. A connection portion of the downstream flow passage 42 and the first bypass flow passage 43 is defined as a connection portion B. A connection portion C is a connection portion between the upstream flow passage 41 and the second bypass flow passage 44. A connection portion between the downstream flow passage 42 and the second bypass flow passage 44 is defined as a connection portion D.

That is, the upstream flow passage 41 includes a flow passage 41a from the discharge side of the chiller 2 to the connection portion A, a flow passage 41b from the connection portion A to the connection portion C, and a flow passage 41c from the connection portion C to the inlet port 13a. The downstream flow passage 42 includes a flow passage 42a from the outlet port 13b to the connection portion D, a flow passage 42b from the connection portion D to the connection portion B, and a flow passage 42c from the connection portion B to the inlet side of the chiller 2. The first valve 51 is disposed in the flow passage 41b. The second valve 52 is disposed in the flow passage 42b. The heating-side pump 3 is disposed in the flow passage 42a as illustrated in FIGS. 1 to 3, but may be disposed in the flow passage 41c.

The temperature control system S includes a variety of sensors for detecting operation conditions. FIGS. 1 to 3 illustrate an example of including a temperature sensor 61 and a flow rate sensor 62.

The temperature sensor 61 detects a temperature with respect to the base 13. In examples illustrated in FIGS. 1 to 3, the temperature sensor 61 is disposed in the flow passage 41c and detects the temperature of brine flowing from the inlet port 13a into the member flow passage 13c of the base 13. The temperature sensor 61 for detecting the temperature with respect to the base 13 is not limited to such a configuration. The temperature sensor 61 may be disposed in the flow passage 42a to detect the temperature of brine flowing through the member flow passage 13c of the base 13 and flowing out of the outlet port 13b. The temperature sensor 61 is preferably located near the inlet port 13a or the outlet port 13b. The temperature sensor 61 may be disposed in the member flow passage 13c and may be configured to detect the temperature of brine flowing through the member flow passage 13c. The temperature sensor 61 may be disposed in the base 13 to detect the temperature of the base 13.

The flow rate sensor 62 detects a flow rate of brine flowing through the member flow passage 13c. In the examples illustrated in FIGS. 1 to 3, the flow rate sensor 62 is illustrated as being disposed in the flow passage 41c, but is not limited to such a configuration. The flow rate sensor 62 may be configured to be disposed in the flow passage 42a. The flow rate sensor 62 is preferably located near the inlet port 13a or the outlet port 13b.

Based on the temperature detected by the temperature sensor 61 and the flow rate detected by the flow rate sensor 62, the temperature of the wafer W placed on the stage 11 can be controlled.

The controller 9 receives a target temperature To with respect to the base 13 as a control command value, a detection temperature T of the temperature sensor 61, and a detection flow rate F of the flow rate sensor 62. Moreover, the controller 9 controls the entire temperature control system S by controlling the heater 12b, the cooler 22, the chiller pump 21, the heating-side pump 3, and the first to fourth valves 51 to 54.

The control device 9 includes a target temperature acquiring unit 91, a temperature acquiring unit 92, a flow rate acquiring unit 93, an operation mode determination unit 94, a valve control unit 95, and a storage unit 96 as function blocks.

The target temperature acquiring unit 91 acquires a target temperature To with respect to the base 13. The target temperature To is determined, for example, depending on the process to be performed by the processing apparatus 1.

The temperature acquiring unit 92 acquires a temperature with respect to the base 13. Specifically, a detected temperature T detected by the temperature sensor 61 is acquired.

The flow rate acquiring unit 93 acquires a flow rate of brine flowing through the member flow passage 13c. Specifically, a detected flow rate F detected by the flow rate sensor 62 is acquired.

The operation mode determination unit 94 determines which of the first to third operation modes illustrated in FIGS. 1 to 3 is to be executed. The determination process of the operation mode determination unit 94 will be described later with reference to FIG. 5.

The valve control unit 95 executes each operation mode by controlling the first to fourth valves 51 to 54 based on the determination result of the operation mode determination unit 94.

The storage unit 96 stores information used for the operation of the temperature control system S.

[Operation Mode of Temperature Control System]

Next, control of the controller 9 and a flow of brine in each mode of operation will be described while using FIG. 4 with also reference to FIGS. 1 to 3. FIG. 4 is a diagram illustrating an example of a state of valves and the like in each operation mode of the temperature control system S according to a first embodiment. As illustrated in FIG. 4, in the first to third operation modes, the cooler 22 is controlled so that the temperature (the chiller discharging temperature) of brine discharged from the chiller 2 is constant (the temperature Tc). The chiller pump (cooling-side pump) 21 is controlled so that the flow rate of brine discharged from the chiller 2 becomes a predetermined flow rate. The heating-side pump 3 is controlled so that the flow rate of brine discharged from the heating-side pump 3 becomes a predetermined flow rate.

[First Operation Mode: Decreasing Temperature/Low Temperature>

The first operation mode illustrated in FIG. 1 (also referred to as a "third process") is an operation mode in which the base 13 is cooled down or in which the temperature of the base 13 is operated at a temperature when the processing apparatus 1 processes the wafer W (low temperature).

As illustrated in FIG. 4, in this operation mode, the first valve 51 and the second valve 52 are fully opened, and the third valve 53 and the fourth valve 54 are closed. The first valve 51 and the second valve 52 may not be fully opened, and at least the flow passages 41b and 42b may allow brine to flow therethrough. Thus, as illustrated in FIG. 1, a first circulating flow passage that allows brine to circulates through the chiller 2, the upstream flow passage 41 (the flow passage 41a, the flow passage 41b, and the flow passage 41c), the member flow passage 13c, and the downstream flow passage 42 (the flow passage 42a, the flow passage 42b, and the flow passage 42c) is formed.

Brine discharged from the chiller 2 flows into the inlet 13a port through the flow passage 41a, the flow passage 41b, and the flow passage 41c. Brine flowing through the member flow passage 13c and flowing out of the outlet port 13b is supplied by the heating-side pump 3 and flows into the chiller 2 through the flow passage 42a, the flow passage 42b, and the flow passage 42c. As described above, in the first operation mode, brine cooled to the temperature Tc by the chiller 2 is supplied to the member flow passage 13c.

[Second Operation Mode: Increasing Temperature]

The second operation mode (also referred to as a "first process") illustrated in FIG. 2 is an operation mode for increasing the temperature of the base 13.

As illustrated in FIG. 4, in this operation mode, the first valve 51 and the second valve 52 are fully closed, and the third valve 53 and the fourth valve 54 are opened. Thus, as illustrated in FIG. 2, a second circulating flow passage that allows brine to circulate through the chiller 2, the flow passage 41a, the first bypass flow passage 43, and the flow passage 42c is formed. Moreover, a third circulating flow passage that allows brine to circulate through the member flow passage 13c, the flow passage 42a, the second bypass flow passage 44, and the flow passage 41c is formed.

Brine discharged from the chiller 2 flows through the flow passage 41a, the first bypass flow passage 43, and the flow passage 42c and flows into the chiller 2. Brine flowing through the member flow passage 13c and flowing out of the outlet port 13b is supplied by the heating-side pump 3, and the brine flows into the inlet port 13a through the flow passage 42a, the second bypass flow passage 44, and the flow passage 41c. As described above, in the second operation mode, brine flowing through the member flow passage 13c does not return to the chiller 2, but circulates through the second bypass flow passage 44. On this occasion, the heater 12b raises the temperature of circulating brine. As a result, brine having a temperature higher than the temperature Tc is supplied to the member flow passage 13c. Brine circulating on the side of the chiller 2 circulates without being heated by the heater 12b.

In the second operation mode, the amount of brine circulating in the flow passage 41c, the member flow passage 13c, the flow passage 42a, and the second bypass flow passage 44 can be decreased (for example, about 1/10) compared to the amount of brine in the entire system. Thus, compared to the conventional configuration of circulating brine throughout the system, the amount of brine to change the temperature can be decreased and the temperature of brine can be increased more efficiently. Then, the temperature of the base 13 can be rapidly increased.

Although an example of using the heater 12b as a heating source for brine has been described, the present embodiment is not limited to such a configuration. The processing apparatus 1 may use heat generated when processing the wafer W as a heat source to heat brine. For example, if the processing apparatus 1 is formed as a plasma processing apparatus, heat generated from plasma within the process chamber 10 may be a heat source for brine.

[Third Operation Mode: High Temperature/Intermediate Temperature]

The third operation mode (also referred to as a "second process") illustrated in FIG. 3 is an operation mode in which the temperature of the base 13 is controlled to a temperature (high temperature and intermediate temperature) at which the processing apparatus 1 processes the wafer W.

As illustrated in FIG. 4, in this operation mode, opening degrees of the first valve 51 and the second valve 52, which are flow adjustment valves, are controlled, and the third valve 53 and the fourth valve 54, which are on-off valves, are opened. Thus, as illustrated in FIG. 3, the first circulating flow passage, the second circulating flow passage, and the third circulating flow passage are formed.

By controlling the opening degrees of the first valve 51 and the second valve 52, a part of the low temperature brine discharged from the chiller 2 is supplied to the inlet port 13a through the flow passage 41b and the flow passage 41c, and the rest is returned to the inlet side of the chiller 2 through the first bypass flow passage 43 and the flow passage 42c. Further, brine flowing through the member flow passage 13c and flowing out of the outlet port 13b is supplied by the heating-side pump 3, part of which is supplied to the inlet side of the chiller 2 through the flow passage 42b and the flow passage 42c, and the rest is returned to the inlet port 13a through the second bypass flow passage 44 and the flow passage 41c.

As described above, in the third operation mode, brine discharged from the chiller 2 and brine discharged from the outlet port 13b having a higher temperature than the brine discharged from the chiller 2 are mixed and supplied to the member flow passage 13c. On this occasion, the mixing rate can be changed by controlling the opening degrees of the first valve 51 and the second valve 52. That is, the temperature of brine supplied to the inlet port 13a can be changed. Thus, brine having a temperature higher than the temperature Tc is supplied to the member flow passage 13c. Further, compared to the conventional configuration of circulating brine throughout the system, the temperature of brine supplied to the member flow passage 13c can be quickly changed in response to a request of the temperature control.

As described above, the first to third operation modes are switched by controlling the open/close and the opening degrees of the first to fourth valves 51 to 54. In other words, in the first operation mode, the flow passage adjusting unit 5 is capable of being in communication with the first circulating flow passage in which brine circulates between the chiller 2 and the member flow passage 13c, and closes the second and third circulating flow passages. In the second operation mode, the second circulating flow passage through which brine circulates between the chiller 2 and the first bypass flow passage 43 is opened; the third circulating flow passage through which brine circulates between the member flow passage 13c and the second bypass flow passage 44 is opened; and the first circulating flow passage is closed. In the third operation mode, the first to third circulating flow passages, and the mixing rate of brine flowing through the first circulating flow passages and brine flowing through the third circulating flow passage are controlled.

[Determination Process of Operation Mode]

Figure 5:
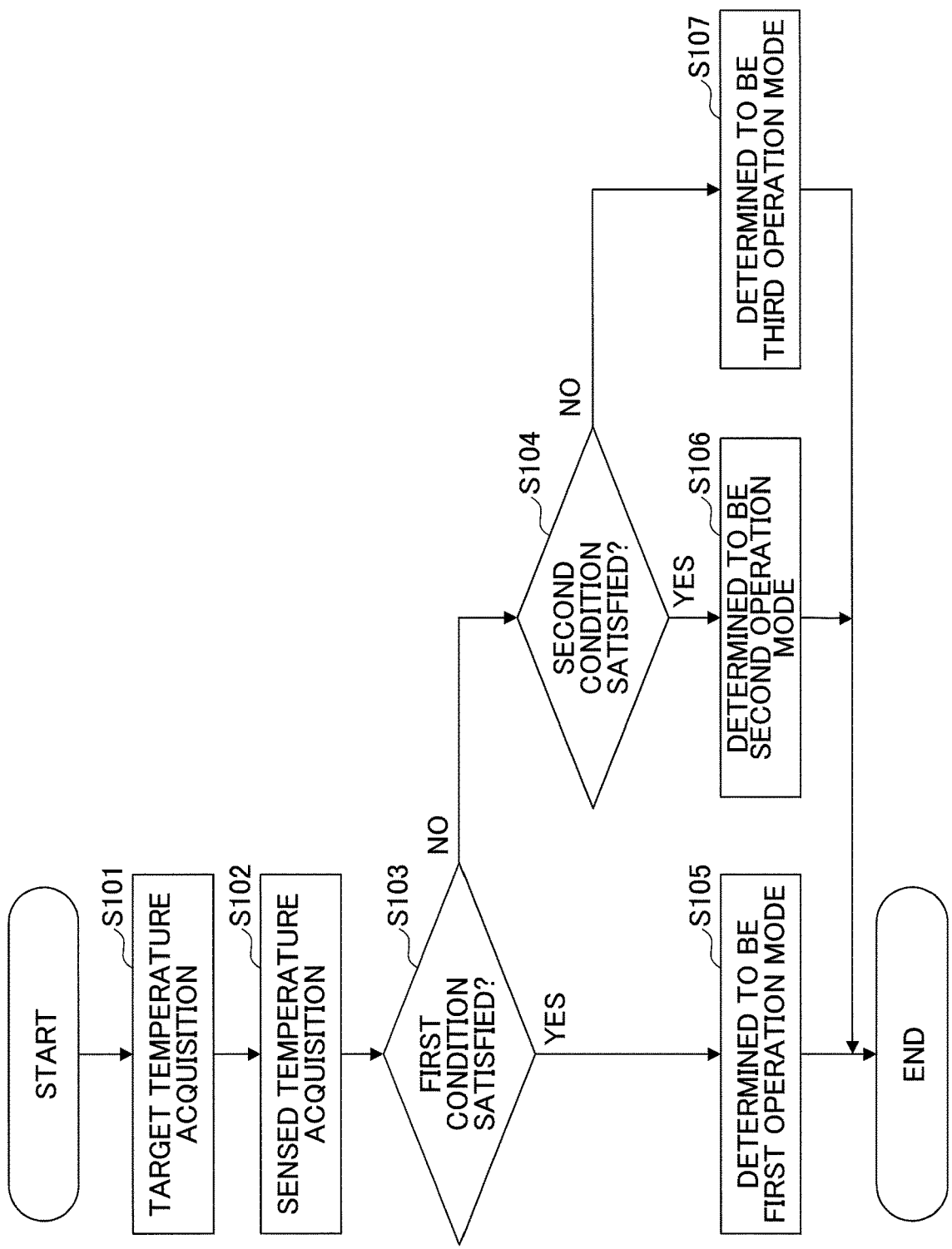
FIG. 5 is a flowchart illustrating a determination process of an operation mode performed by a control device according to a first embodiment.

Next, a determination process of an operation mode performed by the controller 9 will be described with reference to FIG. 5. FIG. 5 is a flowchart illustrating a determination process of an operation mode performed by the controller 9 according to a first embodiment.

In step S101, the target temperature acquiring unit 91 of the controller 9 acquires a target temperature To. For example, the target temperature To is determined depending on the process to be performed by the processing apparatus 1 and is acquired from the process conditions set in a recipe that is stored in the storage unit 96.

In step S102, the temperature acquiring unit 92 of the controller 9 acquires a detected temperature T detected by the temperature sensor 61.

In step S103, the operation mode determination unit 94 of the controller 9 determines whether or not a first condition is satisfied. Here, the first condition is a condition expression for determining whether or not to operate in the first operation mode, which is stored, for example, in the storage unit 96. For example, when the detected temperature T is higher than the target temperature To and the difference is greater than or equal to the first threshold temperature, it is determined that the base 13 is allowed to cool down, and the first condition is satisfied. When the target temperature To is not more than the second threshold temperature, the base 13 is operated at a low temperature, and it is determined that the first condition is satisfied.

When it is determined that the first condition is satisfied (in S103, Yes), the process of the controller 9 proceeds to step S105. When it is determined that the first condition is not satisfied (in S103, No), the process of the controller 9 proceeds to step S104.

In step S104, the operation mode determination unit 94 of the controller 9 determines whether or not a second condition is satisfied. Here, the second condition is a condition expression for determining whether or not to operate in the second operation mode, which is stored, for example, in the storage unit 96. For example, when the detected temperature T is lower than the target temperature To and the difference is greater than or equal to a third threshold temperature, it is determined that the second condition is satisfied and that the temperature of the base 13 is increased.

When it is determined that the second condition is satisfied (in S104, Yes), the process of the controller 9 proceeds to step S106. When it is determined that the second condition is not satisfied (in 104, No), the process of the controller 9 proceeds to step S107.

In step S105, it is determined that the operation mode determination unit 94 of the controller 9 operates in the first operation mode.

In step S106, it is determined that the operation mode determination unit 94 of the controller 9 operates in the second operation mode.

In step S107, it is determined that the operation mode determination unit 94 of the controller 9 operates in the third operation mode.

Hereinafter, the valve control unit 95 of the controller 9 controls the first to fourth valves 51 to 54 based on the determination result of the operation mode determination unit 94 and operates the temperature control system S in any operation mode of the first to third operation modes.

[Valve Control in Third Operation Mode]

Next, opening degree control of the flow adjustment valves (the first valve 51 and the second valve 52) in the third operation mode will be described.

In the third operation mode, as the opening degree of the first valve 51 increases, the flow rate of brine flowing through the flow passage 41b increases, and the temperature of brine supplied into the member flow passage 13c decreases. Further, the lower the opening degree of the first valve 51 becomes, the lower the flow rate of brine flowing through the flow passage 41b becomes, and the higher the temperature of brine supplied to the member flow passage 13c becomes. Further, as the opening degree of the second valve 52 increases, the flow rate of brine flowing through the second bypass flow passage 44 decreases, and the temperature of brine supplied to the member flow passage 13c decreases. Further, as the opening degree of the second valve 52 decreases, the flow rate of brine flowing through the second bypass flow passage 44 increases, and the temperature of brine supplied to the member flow passage 13c increases. The valve control unit 95 controls the opening degree of the first valve 51 and the second valve 52 so that the detected temperature T of the temperature sensor 61 approaches the target temperature To.

Figure 6:
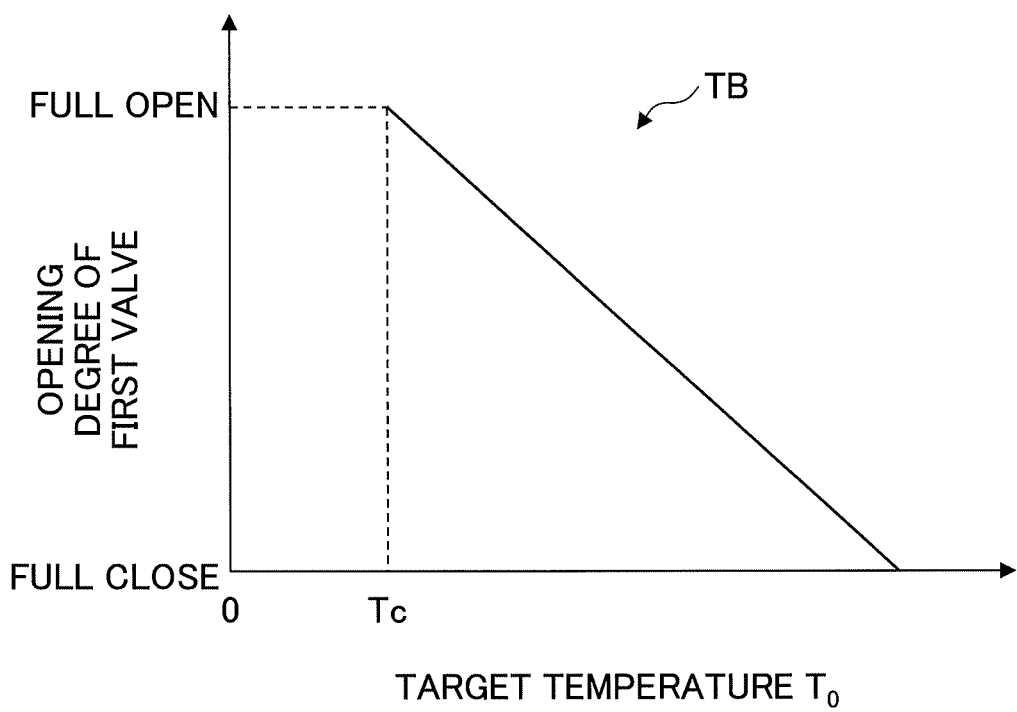
FIG. 6 is an example of a correlation table storing correlation data between a target temperature and an opening degree of a first valve.

FIG. 6 is an example of a correlation table TB that stores correlation data between the target temperature To and the opening of the first valve 51. Although the correlation data is stored in a table format, FIG. 6 schematically illustrates the correlation data in a graph format for convenience of explanation.

In the correlation table TB illustrated in FIG. 6, the horizontal axis indicates a target temperature To and the vertical axis indicates an opening degree of the first valve 51. In the experiment for obtaining the correlation table TB, correlation data of the temperature of brine supplied to the member flow passage 13c while changing the opening degree of the first valve 51 are obtained in advance and stored in the storage unit 96. The temperature of brine supplied to the member flow passage 13c is measured by the temperature sensor 61. The correlation data stored in the correlation table TB is not limited thereto, but may be a slope or curve other than a straight line illustrated in the correlation table TB.

The valve control unit 95 controls the opening degree of the first valve 51 based on the correlation table TB and the target temperature To. Similarly, the valve control unit 95 controls the opening degree of the second valve 52 based on the table TB and the target temperature To. The table TB used for the control of the first valve 51 and the table TB used for the control of the second valve 52 may be the same table or may be different tables.

The opening degree control of the first valve 51 and the second valve 52 by the valve control unit 95 is not limited thereto, and various methods may be applied thereto.

For example, the storage unit 96 may store a correlation table storing the correlation between the opening degree of the first valve 51, the opening degree of the second valve 52 and the mixing rate. The valve control unit 95 calculates a mixing rate such that the temperature of brine supplied to the member flow passage 13c becomes the target temperature To based on the temperature of brine supplied to the connection portion A from the flow passage 41b (that is, the temperature Tc), the temperature of brine supplied to the connection portion A from the second bypass flow passage 44 (that is, the temperature of brine flowing out of the member flow passage 13c), and the target temperature To. Then, the opening degree of the first valve 51 and the opening degree of the second valve 52 are determined based on the calculated mixing rate and the correlation table, and the valve control unit 95 performs control using the determined opening degree. The flow passage 42a preferably includes a temperature sensor.

For example, the opening degree of the first valve 51 may be controlled by feedback using the temperature sensor 61. That is, when the detected temperature T of the temperature sensor 61 is higher than the target temperature To, the opening degree of the first valve 51 is increased. When the detected temperature T of the temperature sensor 61 is lower than the target temperature To, the opening degree of the first valve 51 is decreased. Also, the opening degree of the second valve 52 may be controlled by feedback using the flow rate sensor 62. That is, when the detected flow rate F of the flow sensor 62 is higher than a predetermined setting flow rate, the opening degree of the second valve 52 is increased. When the detected flow rate F of the flow rate sensor 62 is lower than a predetermined setting flow rate, the opening degree of the second valve 52 is decreased.

Moreover, for example, the opening degree of the second valve 52 may be controlled by feedback using the temperature sensor 61. That is, when the detected temperature T of the temperature sensor 61 is higher than the target temperature To, the opening degree of the second valve 52 is increased. If the detected temperature T of the temperature sensor 61 is lower than the target temperature To, the opening degree of the second valve 52 is decreased. The opening degree of the first valve 51 may be controlled by feedback using the flow rate sensor 62. That is, when the detected flow rate F of the flow rate sensor 62 is higher than a predetermined setting flow rate, the opening degree of the first valve 51 is decreased. When the detected flow rate F of the flow rate sensor 62 is lower than a predetermined setting flow rate, the opening degree of the first valve 51 is increased.

As described above, according to the temperature control system S in the first embodiment, the first to third operation modes are switched by controlling the open/close and the opening degree of the first to fourth valves 51 to 54. Thus, the temperature of brine supplied to the member flow passage 13c can be adjusted without changing the chiller discharging temperature Tc. In the second and third operation modes, brine at a temperature higher than the temperature Tc of brine discharged from the chiller 2 can be supplied to the member flow passage 13c.

In addition, according to the temperature control system S according to the first embodiment, when the base 13 is heated, the amount of brine to heat the base 13 can be made a part of the amount of brine of the entire system. This allows the temperature of brine to rise rapidly compared to the configuration of a conventional temperature control system that increases the temperature of brine throughout the system. Efficient temperature change is possible.

Further, according to the temperature control system S of the first embodiment, the temperature can be adjusted using a single chiller 2. This allows an installation area to be reduced compared to a configuration in which a plurality of temperature control units is installed.

Further, according to the temperature control system S of the first embodiment, the temperature of brine supplied to the member flow passage 13*c* can be adjusted by the control of the flow passage adjusting unit 5 without changing the chiller discharging temperature Tc from the cooler 22, the discharge flow rate of the chiller pump 21, and the discharge flow rate of the heating-side pump 3. For this reason, even when the chiller 2 having a fixed discharge temperature or a fixed discharging flow rate or the heating-side pump 3 having a discharging flow rate is used, the temperature of brine that is supplied to the member flow passage 13*c* can be appropriately adjusted, and thus the device configuration can be simplified.

[Configuration of Temperature Control System of Second Embodiment]

Figure 7:
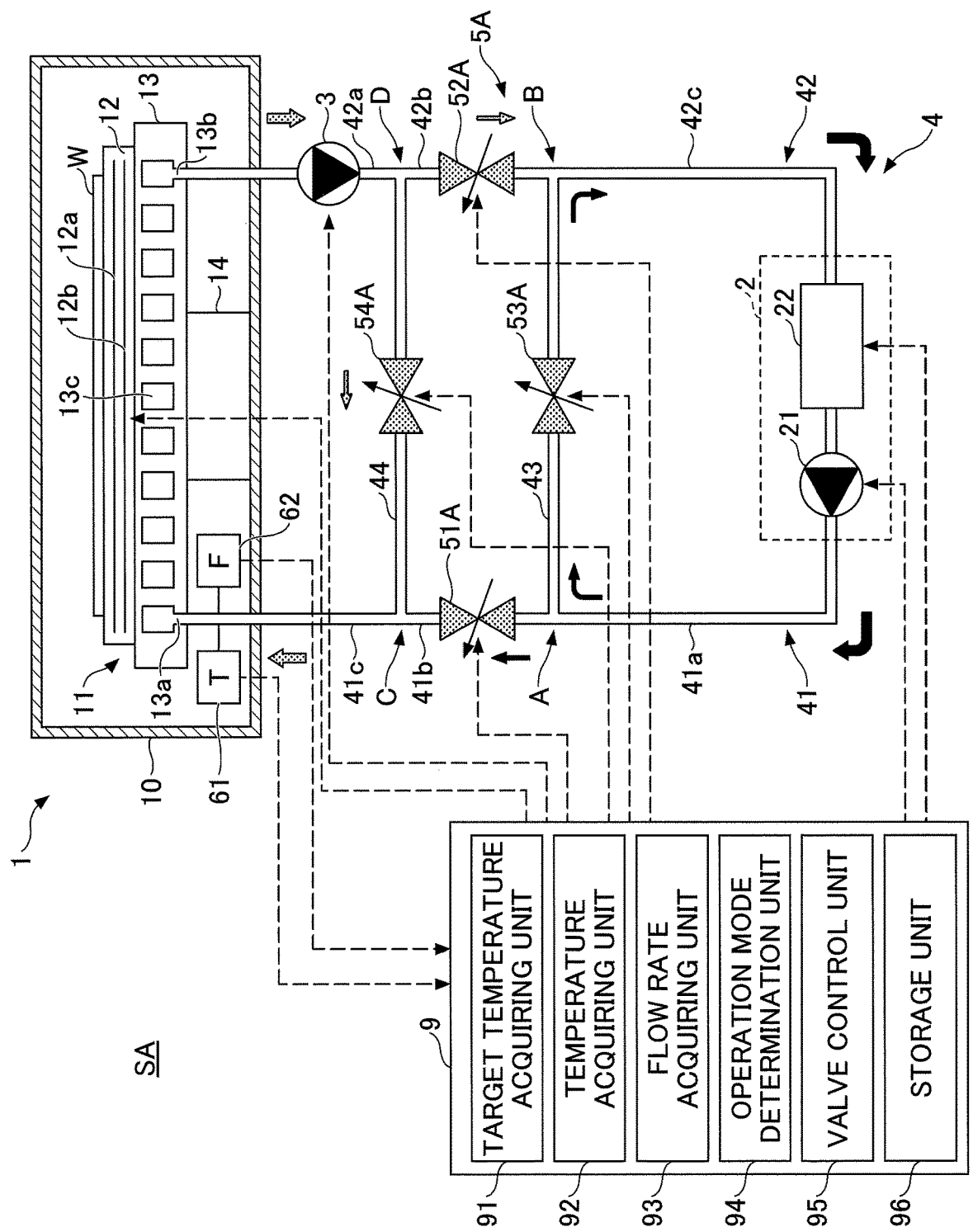
FIG. 7 is a; diagram illustrating a configuration of a temperature control system according to a second embodiment.

Next, a temperature control system SA according to a second embodiment will be described with reference to FIGS. 7 and 8. FIG. 7 is a diagram illustrating a configuration of the temperature control system SA according to the second embodiment. FIG. 7 illustrates operation in a third operation mode. FIG. 8 is a diagram illustrating examples of states of valves and the like in each operation mode of the temperature control system SA according to the second embodiment.

The temperature control system SA according to the second embodiment illustrated in FIG. 7 has a different configuration of a flow passage adjusting unit 5A compared to the temperature control system S according to the first embodiment illustrated in FIG. 1 and the like.

The flow passage adjusting unit 5A includes a first valve 51A, a second valve 52A, a third valve 53A, and a fourth valve 54A. The first valve 51A is disposed in a flow passage 41*b* of an upstream flow passage 41. The second valve 52A is disposed in a flow passage 42*b* of a downstream flow passage 42. The third valve 53A is disposed in a first bypass passage 43. The fourth valve 54A is disposed in a second bypass passage 44. The first to fourth valves 51A to 54A are flow adjustment valves that can adjust an opening degree, and the opening degree is controlled by a controller 9.

As illustrated in FIG. 8, in a first operation mode, the first valve 51A and the second valve 52A are fully opened, and the third valve 53A and the fourth valve 54A are fully closed. The first valve 51A and the second valve 52A may not be fully opened, and at least the flow passages 41*b* and 42*b* may allow brine to flow through. In the second operation mode, the first valve 51A and the second valve 52A are fully closed, and the third valve 53A and the fourth valve 54A are fully opened. The third valve 53A and the fourth valve 54A may not be fully opened, and at least the bypass passages 43 and 44 may allow brine to flow through. In the third operation mode, the opening degrees of the first to fourth valves 51A to 54A, which are the flow adjustment valves, are controlled. The controller 9 can change the temperature of brine supplied to the inlet port 13*a* by controlling the degrees of valve openings of the first to fourth valves 51A to 54A.

As described above, according to the temperature control system SA according to the second embodiment, similarly to the temperature control system S according to the first embodiment, the first to third operation modes are switched by controlling the opening degrees of the first to fourth valves 51A to 54A. Thus, the temperature of brine supplied to the member flow passage 13*c* can be adjusted without changing the chiller discharging temperature Tc. In the second and third operation modes, brine at a temperature higher than the temperature Tc of brine discharged from the chiller 2 can be supplied to the member flow passage 13*c*.

In a third operation mode in the temperature control system SA, the higher the opening degree of the first valve 51A becomes, the higher the flow rate of brine flowing through the flow passage 41*b* becomes, and the lower the temperature of brine supplied to the member flow passage 13*c* becomes. Further, the lower the opening degree of the first valve 51A becomes, the lower the flow rate of brine flowing through the flow passage 41*b* becomes, and the higher the temperature of the brine supplied to the member flow passage 13*c* becomes. Further, as the opening degree of the second valve 52A increases, the flow rate of brine flowing through the second bypass flow passage 44 decreases, and the temperature of brine supplied to the member flow passage 13*c* decreases. Further, as the opening degree of the second valve 52A decreases, the flow rate of brine flowing through the second bypass flow passage 44 increases, and the temperature of brine supplied to the member flow passage 13*c* increases. Further, the lower the opening degree of the third valve 53A becomes, the higher the flow rate of brine flowing through the flow passage 41*b* becomes, and the lower the temperature of the brine supplied to the member flow passage 13*c* becomes. Further, the higher the opening degree of the third valve 53A becomes, the lower the flow rate of brine flowing through the flow passage 41*b* becomes, and the higher the temperature of brine supplied to the member flow passage 13*c* becomes. Further, as the opening degree of the fourth valve 54A decreases, the flow rate of brine flowing through the second bypass flow passage 44 decreases, and the temperature of the brine supplied to the member flow passage 13*c* decreases. Further, as the opening degree of the fourth valve 54A increases, the flow rate of brine flowing through the second bypass flow passage 44 increases, and the temperature of brine supplied to the member flow passage 13*c* increases.

[Configuration of Temperature Control System of Third Embodiment]

Figure 9:
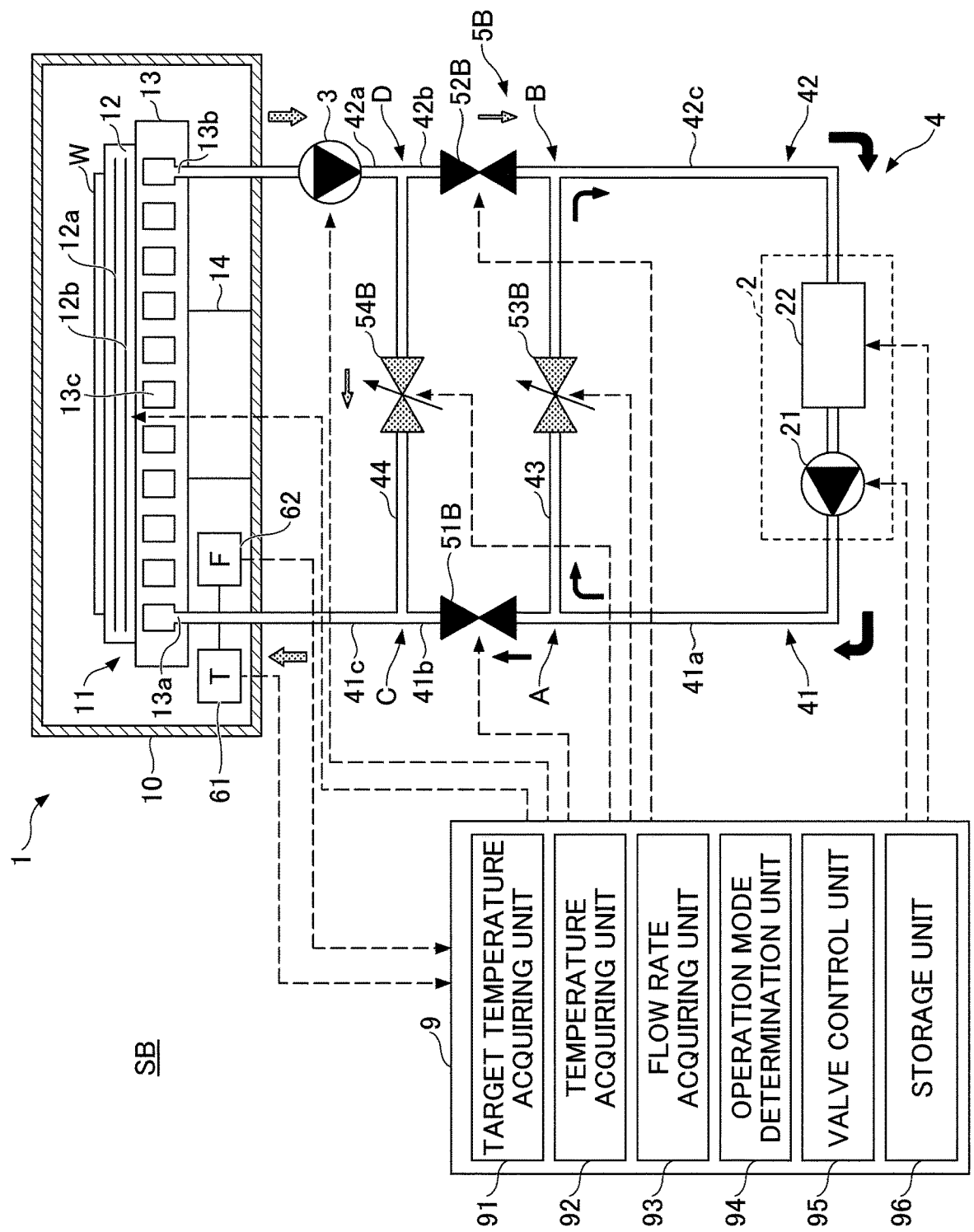
FIG. 9 is a schematic diagram illustrating a configuration of a temperature control system according to a third embodiment.

Next, a temperature control system SB according to a third embodiment will be described with reference to FIGS. 9 and 10. FIG. 9 is a configuration diagram of the temperature control system SB according to the third embodiment. FIG. 9 illustrates operation in a third operation mode. FIG. 10 is a diagram illustrating examples of states of valves and the like in each operation mode of the temperature control system SB according to the third embodiment.

The temperature control system SB according to the third embodiment illustrated in FIG. 9 has a different configuration of a flow passage adjusting unit 5B compared to the temperature control system S according to the first embodiment illustrated in FIG. 1 and the like.

The flow passage adjusting unit 5B includes a first valve 51B, a second valve 52B, a third valve 53B, and a fourth valve 54B. The first valve 51B is disposed in a flow passage 41*b* of an upstream flow passage 41. The second valve 52B is disposed in a flow passage 42*b* of a downstream flow passage 42. The third valve 53B is disposed in a first bypass passage 43. The fourth valve 54B is disposed in a second bypass passage 44. The first and second valves 51B and 52B are open/close valves, which are controlled by a controller 9. The third and fourth valves 53B and 54B are flow adjustment valves that can adjust opening degrees, and the opening degrees are controlled by the controller 9.

As illustrated in FIG. 10, in a first operation mode, the first valve 51B and the second valve 52B open, and the third valve 53B and the fourth valve 54B fully close. In the second operation mode, the first valve 51B and the second valve 52B are closed, and the third valve 53B and the fourth valve 54B are fully opened. The third valve 53B and the fourth valve 54B may not be fully opened, and at least the bypass passages 43 and 44 may allow brine to flow through. In the third operation mode, the opening degrees of the third valve 53B and the fourth valve 54B, which are flow adjustment valves, are controlled, and the first valve 51B and the second valve 52B, which are open/close valves, are open/close valves. The controller 9 can change the temperature of brine supplied to an inlet port 13a by controlling the valve openings of the third and fourth valves 53B and 54B.

As described above, according to the temperature control system SB according to the third embodiment, similarly to the temperature control system S according to the first embodiment, the first to third operation modes are switched by controlling the open/close and the opening degree of the first to fourth valves 51B to 54B. Thus, the temperature of brine supplied to the member flow passage 13c can be adjusted without changing the chiller discharging temperature Tc. In the second and third operation modes, brine at a temperature higher than the temperature Tc of brine discharged from the chiller 2 can be supplied to the member flow passage 13c.

In the third operation mode in the temperature control system SB, the lower the opening of the third valve 53B becomes, the higher the flow rate of brine flowing through the flow passage 41b becomes, and the lower the temperature of brine supplied to the member flow passage 13c becomes. Further, as the opening of the third valve 53B increases, the flow rate of brine flowing through the flow passage 41b decreases, and the temperature of brine supplied into the member flow passage 13c increases. Further, as the opening degree of the fourth valve 54B decreases, the flow rate of brine flowing through the second bypass flow passage 44 decreases, and the temperature of brine supplied to the member flow passage 13c decreases. Further, as the opening degree of the fourth valve 54B increases, the flow rate of brine flowing through the second bypass flow passage 44 increases, and the temperature of brine supplied to the member flow passage 13c increases.

The preferred embodiments of the present disclosure have been described above in detail. However, the present disclosure is not limited to the embodiments described above. Various modifications, substitutions, and the like may be applied to the embodiments described above without departing from the scope of the present disclosure. Also, the features described separately may be combined unless there is a technical inconsistency.

The flow passage adjusting unit 5 and the flow passage adjusting unit 5A are described by citing an example of being formed as two flow rate adjusting valves and two open/close valves. However, the present disclosure is not limited thereto, and all four valves may be flow rate adjusting valves.

A check valve may be disposed in the flow passage 42b including the second valve 52. Thus, brine can be prevented from flowing backward from the connection portion B toward the connection portion D. The position where the check valve is disposed is not limited to the flow passage 42b, but may be provided in another flow passage.

Further, the flow passage adjusting unit 5 may be configured to include a three-way flow divider valve that can adjust the opening degree at the connecting portion a instead of the first valve 51 and the third valve 53. The three-way flow divider valve disposed in the connection portion A has one inlet port and two outlet ports. The inlet port is connected to the flow passage 41a; the first outlet port is connected to the flow passage 41b; and the second outlet port is connected to the first bypass passage 43. The three-way flow divider valve is configured such that the opening degree of one outlet port decreases as the opening degree of the other outlet port increases. Alternatively, the second and fourth valves 52 and 54 may include a three-way flow divider valve that can adjust the opening degree of the connection portion D. The three-way flow divider valve disposed in the connection d has one inlet port and two outlet ports. The inlet port is connected to the flow passage 42a; the first outlet port is connected to the flow passage 42b; and the second outlet port is connected to the second bypass passage 44. Even in such a configuration, by controlling the opening degree of the three-way flow divider valve, the temperature control system S can be operated in the first to third operation modes similarly to the temperature control system S according to the first embodiment.

Further, the flow passage adjusting unit 5 may be configured to include a three-way confluence valve that can adjust the opening degree of the connection portion C instead of the first valve 51 and the fourth valve 54. The three-way confluence valve disposed in the connection portion C has two inlet ports and one outlet port. The first inlet port is connected to the flow passage 41b; the second inlet port is connected to the second bypass passage 44; and the outlet port is connected to the flow passage 41c. The three-way confluence valve is configured such that the opening degree of one inlet port decreases as the opening degree of the other inlet port increases. Alternatively, the second valve 52 and the third valve 53 may be replaced by a three-way confluence valve that can adjust the opening degree of the connection portion B. The three-way confluence valve disposed in the connection portion B has two inlet ports and one outlet port. The first inlet port is connected to the flow passage 42b; the second inlet port is connected to the first bypass passage 43, and the outlet port is connected to the flow passage 42c. Even in this configuration, the temperature control system S can be operated in the first to third operation modes by controlling the opening degree of the three-way confluence valve similarly to the temperature control system S according to the first embodiment.

Further, although the member to which the temperature controlled medium is supplied has been described as an example of the base 13 having the member flow passage 13c, this is not limited thereto. A member flow passage may be provided in a member having a function of an upper electrode, and the temperature controlled medium may be supplied to the member flow passage. Thus, the member that serves as the upper electrode can be protected from heat generated by plasma.

As described above, according to an embodiment of the present disclosure, a temperature control system and a temperature control method that can efficiently change a temperature of a temperature controlled medium flowing through a flow passage of a member can be provided.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A system for controlling a temperature of a target having an internal flow passage having an inlet and an outlet, the system comprising:
   an external flow passage extending from the inlet to the outlet, the internal and external flow passages being configured to circulate a heat transfer fluid;
   a first bypass passage disposed in the external flow passage;
   a second bypass passage disposed in the external flow passage. wherein the second bypass passage is adjacent to the target, and the first bypass passage is further away from the target than the second bypass passage is along the flow direction;
   a first pump disposed on the external flow passage and downstream of the outlet or upstream of the inlet, the first pump being configured to circulate the heat transfer fluid;
   a thermoregulator disposed at a midpoint of the external flow passage;
   a second pump disposed on the external flow passage and downstream of the thermoregulator, the second pump being configured to circulate the heat transfer fluid;
   a first valve disposed on the external flow passage, downstream of the second pump, and between the first bypass passage and the second bypass passage;
   a second valve disposed on the external flow passage, upstream of the thermoregulator, and between the second bypass passage and the first bypass passage;
   a third valve disposed on the first bypass flow passage; and
   a fourth valve disposed on the second bypass flow passage,
   wherein at least one of a first valve pair including the first valve and the second valve and a second valve pair including the third valve and the fourth valve consists of flow control valves.

2. The system as claimed in claim 1, wherein the other pair of the first valve pair or the second valve pair also consists of on-off valves.

3. The system as claimed in claim 1, wherein the first pump is disposed between the outlet and an upstream junction with the second bypass flow passage on the external flow passage.

4. The system as claimed in claim 1, wherein the first pump is disposed between the inlet and a downstream junction with the second bypass flow passage on the external flow passage.

5. The system as claimed in claim 1, further comprising:
   a controller configured to control the first valve, the second valve, the third valve, and the fourth valve, to:
   circulate a part of the heat transfer fluid through the thermoregulator and the first bypass flow passage while circulating another part of the heat transfer fluid through the internal flow passage and the second bypass flow passage; and
   supply the heat transfer fluid that has been temperature-modulated in the thermoregulator to the internal flow passage.

6. The system as claimed in claim 5, wherein the controller is configured to close the first valve and the second valve and to open the third valve and the fourth valve when circulating.

7. The system as claimed in claim 6, wherein the controller is configured to open the first valve to the fourth valve when supplying.

8. The system as claimed in claim 5, wherein the controller is configured to control the first valve, the second valve, the third valve, and the fourth valve, to supply the heat transfer fluid that has been temperature-modulated in the thermoregulator to the internal flow passage, wherein the controller is configured to open the first valve and the second valve and close the third valve and the fourth valve.

9. The system as claimed in claim25, further comprising:
   a theiniosensor disposed between the inlet or outlet of the internal flow passage and the downstream or upstream junction with the second bypass flow passage on the external flow passage,
   wherein the controller is configured to control at least one pair of the first valve pair of the first valve and the second valve and the second valve pair of the third valve and the fourth valve based on a temperature detected by the thermosensor.

10. The system as claimed in claim 5, further comprising:
    a flow rate sensor disposed between the inlet or outlet of the internal flow passage and the downstream or upstream junction with the second bypass flow passage on the external flow passage,
    wherein the controller is configured to control at least one pair of the first valve pair of the first valve and the second valve and the second valve pair of the third valve and the fourth valve based on a flow rate detected by the flow rate sensor.

11. The system as claimed in claim 1, wherein the target is heated by at least one of a plasma generated in a chamber and a heater disposed in the target.

12. The system as claimed in claim 1, wherein the first to fourth valves are all flow control valves.

13. The system as claimed in claim 1, further comprising:
    a check valve disposed on one of the external flow passage, the first bypass flow passage, and the second bypass flow passage.

14. A system for controlling a temperature of a target having an internal flow passage having an inlet and an outlet, the system comprising:
    an external flow passage extending from the inlet to the outlet, the internal and external flow passages being configured to circulate a heat transfer fluid;
    a first bypass passage disposed in the external flow passage;
    a second bypass passage disposed in the external flow passage, wherein the second bypass passage is adjacent to the target, and the first bypass passage is further away from the target than the second bypass passage is along the flow direction;
    a first pump disposed on the external flow passage, and downstream of the outlet or upstream of the inlet, the first pump being configured to circulate the heat transfer fluid;
    a thermoregulator disposed at a midpoint of the external flow passage;
    a second pump disposed on the external flow passage and downstream of the thermoregulator, the second pump being configured to circulate the heat transfer fluid;
    a second flow passage to circulate the heat transfer fluid;

a flow adjuster configured to adjust flow of the heat transfer fluid; and a controller configured to control the flow adjuster, wherein the internal flow passage, thermoregulator and a part of the external flow passage define a first circulating flow passage;

another part of the external flow passage, the thermoregulator and the first bypass flow passage define a second circulating flow passage;

the internal follow flow passage, an upstream part of the external flow passage, the second bypass flow passage, and a downstream part of the external flow passage define a third circulating flow passage, the controller is configured to permit the flow controller to:

circulate a part of the heat transfer fluid through the second circulating flow passage and circulating another part of the heat transfer fluid through the third circulating flow passage while closing the first circulating flow passage; and circulate the heat transfer fluid through the first to the third circulating flow passages while controlling a mixing ratio of a part of the heat transfer fluid flowing through the first circulating flow passage and another part of the heat transfer fluid flowing through the third circulating flow passage.

15. A method of controlling a temperature of a target by a system, the target having a flow passage having an inlet and an outlet, the system comprising:

a first pump configured to circulate a heat transfer fluid through the flow passage;

a second pump configured to discharge the heat transfer fluid;

a thermoregulator;

a first flow passage connecting one end of the flow passage to one end of the thermoregulator to allow the heat transfer fluid to flow therethrough;

a second flow passage connecting the other end of the flow passage to the other end of the thermoregulator to allow the heat transfer fluid to flow therethrough;

a first valve disposed in the first flow passage;

a second valve disposed in the second flow passage;

a first bypass flow passage connecting the first flow passage to the second flow passage at a position closer to the thermoregulator than the first valve and the second valve;

a second bypass flow passage connecting the first flow passage to the second flow passage at a position closer to the flow passage than the first valve and the second valve;

a third valve disposed in the first bypass flow passage; and a fourth valve disposed in the second bypass flow passage, at least one of a pair of the first valve and the second valve and a pair of the third valve and the fourth valve being a pair of flow control valves;

the method comprising:

circulating a part of the heat transfer fluid through the thermoregulator and the first bypass flow passage while circulating another part of the heat transfer fluid through the flow passage and the second bypass flow passage; and supplying part of the heat transfer fluid temperature-modulated in the thermoregulator to the flow passage.

16. The method as claimed in claim 15, further comprising steps of:

determining a temperature of the heat transfer fluid is lower than a target temperature by a threshold temperature difference or more before the step of circulating the heat transfer fluid; and determining the temperature of the heat transfer fluid is higher than the target temperature minus the threshold temperature difference between the circulating and the supplying.

* * * * *